United States Patent [19]

Jantsch et al.

[11] 4,119,841
[45] Oct. 10, 1978

[54] APPARATUS FOR THE IMPLEMENTATION OF A METHOD FOR PRODUCING A SECTIONAL VIEW OF A BODY

[75] Inventors: Ottomar Jantsch; Karl Reiss, both of Erlangen, Germany

[73] Assignee: Siemens Aktiengesellschaft, Berlin and Munich, Germany

[21] Appl. No.: 671,049

[22] Filed: Mar. 29, 1976

[30] Foreign Application Priority Data

Apr. 2, 1975 [DE] Fed. Rep. of Germany ....... 2514409

[51] Int. Cl.² .......................... H01J 31/50; G01T 1/24
[52] U.S. Cl. .............................. 250/213 VT; 250/370; 357/24
[58] Field of Search ................ 250/330, 332, 370, 371, 250/445 T, 213 VT; 357/24

[56] References Cited

U.S. PATENT DOCUMENTS

| 3,806,729 | 4/1974 | Caywood | 250/370 X |
| 3,881,110 | 4/1975 | Hounsfield et al. | 250/445 T X |
| 3,887,810 | 6/1975 | Skaggs | 250/213 VT X |
| 3,902,066 | 8/1975 | Roosild et al. | 250/332 |
| 3,927,418 | 12/1975 | Ando et al. | 357/24 |

Primary Examiner—Archie R. Borchelt
Attorney, Agent, or Firm—Kenyon & Kenyon, Reilly, Carr & Chapin

[57] ABSTRACT

In a scanner for producing a sectional view of a body spatially resolving semiconductors, each having a charge transfer element associated therewith at which the formation of the signal is accomplished by charge storage and charge transfer in a semiconductor body, are utilized.

5 Claims, 4 Drawing Figures

APPARATUS FOR THE IMPLEMENTATION OF A METHOD FOR PRODUCING A SECTIONAL VIEW OF A BODY

BACKGROUND OF THE INVENTION

This invention relates to a method for producing a sectional view of a body, the picture elements of which are derived from the absorption of ionizing rays, preferably X- or gamma-rays in general and more particularly to an improved apparatus for carrying out such a method.

In such methods rays pass through the respective body element in the cross-sectional plane of the body in different directions. In a system of radiation receivers they are converted into electrical signals and are evaluated in an electronic storage system. Arrangements for implementing such a method, in which the body is scanned by parallel displacement of the radiation source and the radiation receiver in the cross-sectional plane of the body, are known as "scanners".

In one arrangement for implementing a method of this nature, a detector system with spatially resolving semiconductor detectors for electron beams which are released in the photocathode of an electronic vacuum image converter are used. The scintillator of the image converter is used as the receiver of the fan-shaped ray beam. In this arrangement, all the electrical signals associated with the fan-shaped beam are imaged and picked up simultaneously. Scanning the cross-sectional plane of the body by parallel displacement of the radiation source and the radiation receiver is therefore no longer necessary.

For accelerating the electrons, a solid-state image converter may be used. A vacuum image converter, in which the electrons released from a photocathode are accelerated in a vacuum section by an applied voltage of, e.g., 20 kV, is particularly well suited. The electrons then strike a detector system which contains spatially resolving detectors which are arranged in the detector system side-by-side in the cross-sectional plane of the body. The detector system contains an output line for each detector through which the output signal is fed to an electronic system. This electronic system processes the individual signals and then displays the sectional view of the body on a display screen, or the system also may contain a printer which prints out the sectional view of the body to be produced. The individual connecting leads between the detectors and the electronic system each must be brought out of the vacumm system with a feedthrough.

SUMMARY OF THE INVENTION

The present invention is based on the discovery that the equipment for the overall arrangement can be simplified substantially if semiconductor components whose action is based on the transfer of charge carriers are used in the detector system.

As is well known, such semiconductor components can be made by MOS (metal oxide semiconductor) technology. The charge carriers are generated in the semiconductor body by incident radiation and shifted in the semiconductor body by means of charge transfer elements. These semiconductor components are known under the acronym CTD (charge transfer devices). In what are known as BBD (bucket brigade device) elements, the charges can be stored as majority carriers or, in what are known as CCD (charge-coupled device) elements, also as minority carriers. In these CCD elements the charge carriers stored under an electrode at the surface of the semi-conductor body form what is referred to as a potential trough. The electrical signal is then generated after repeated transfer of the charge carriers to the respective adjacent electrode up to the read-out element, which is arranged next to the last electrode ("Charge Transfer Devices" from "Journal Vac. Sci. Technol.", vol. 9, no. 4, July/August 1972, pages 1166 to 1180). These components are fabricated using standard MOS technology, in which semiconductor bodies of n-conduction silicon with a resistivity of about 10 ohm-cm are used ("The Bell System Technical Journal", Sept., 1972, pages 1635 to 1640, particularly page 1636). For, such semiconductor material is easy to process since it is relatively insensitive to the inward diffusion of undesired faults and outward diffusion of doping material.

It has also been previously proposed to let light radiation act from the flat side of the common semiconductor body opposite the electrodes in such CCD elements with a large number of individual detectors of integrated construction ("Electronics", May 11, 1970, pages 112 to 118). However, it is difficult to design the semiconductor body which is effective for the charge storage and the charge transfer.

It was discovered that these known detectors can be used as image converters for rays, preferably cathode rays, since their raster dimensions of less than 100 mm are at least one order of magnitude smaller than the raster dimensions of strip detectors. Accordingly, these smaller raster dimensions bring about increased resolution. However, their use is possible only if one succeeds in designing the semiconductor body so that sufficient charge storage is accomplished by the incident radiation.

According to the present invention, the problem mentioned, i.e., to simplify and improve the arrangement for implementing a method of the typed described above, is solved by providing spatially resolving semiconductor detectors, each having a charge transfer element associated therewith, at which the formation of the signal is accomplished by charge storage and charge transfer in the semiconductor body. The semiconductor detectors are electrically conneted with their associated charge transfer element. The charge formed in the detector is fed to the charge transfer element. The signal is then formed by charge storage and charge transfer in the manner of a shift register.

They can also form a common component and be provided with a common semiconductor body, the one flat side of which is provided with the charge transfer electrodes, in which the formation of the signal is accomplished by charge storage and charge transfer in the semiconductor body. The electrical signal occurs in this arrangement after repeated transfer of the storage carriers to the respective adjacent electrode up to the read-out element. Therefore, only a single output line need to be brought out of the vacuum vessel of the detector system.

In one preferred embodiment of the arrangement according to the present invention, the semiconductor body of the detectors consists of n-conduction silicon with a high resistivity of at least 600 ohm-cm, which is reduced to a thickness of at most 80 mm. In an analogous manner, the semi-conductor body may also consist of a p-conduction silicon with a resistivity of at least 1800 ohm-cm. The surface opposite the charge transfer electrodes, i.e., the other flat side of the semiconductor body, can preferably be provided as a receiving surface for the electron rays. The radiation effective for the charge storage must reach the potential trough mentioned above. The semiconductor body therefore is given the highest possible resistivity, which in the case of n-conduction material will preferably be at least 1200 ohm-cm, so that a sufficient depth of the potential trough is obtained even with a relatively low operating voltage. The trough boundary then shifts toward the incident radiation and is more easily reached by the latter. In addition, the surface of the semiconductor body opposite the incident radiation is reduced and this surface is thereby shifted toward the boundary of the potential trough. The semiconductor body can therefore preferably be reduced to a thickness of less than 60 μm, in particular, a thickness of less than 40 μm, advantageously by thin-etching.

If, for instance, an electron accelerated by a voltage of 20 kV enters into a silicon semiconductor body, it generates therein a cloud of charge carriers. An energy of 3.6 eV is required per electron-hole pair. Each entering electron therefore produces about 5000 electron-hole pairs.

DETAILED DESCRIPTION OF THE PREFERRED EMBODIMENT

Figure 1:
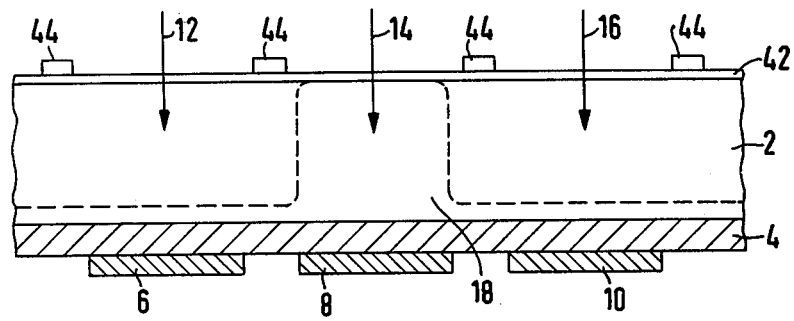
FIG. 1 is an elevation view, partially in cross section, of the semiconductor of the present arrangement.
Figure 1A:
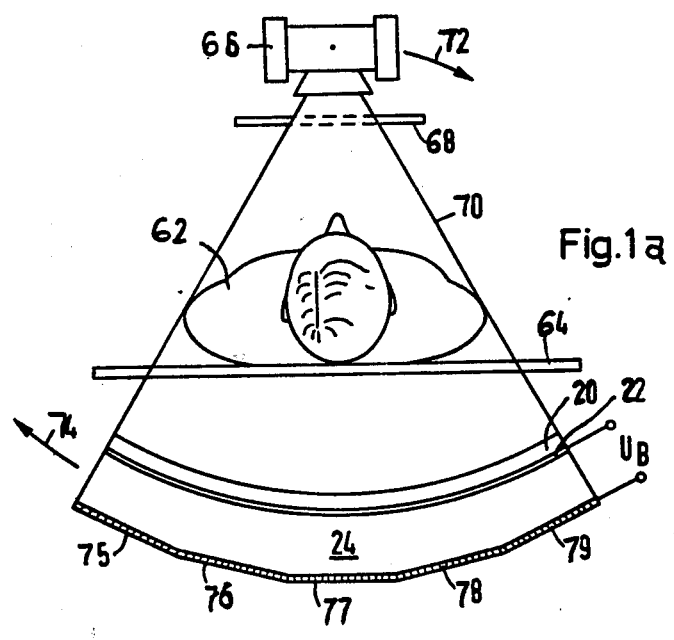
FIG. 1a is an elevation view of the overall arrangement in which the detectors of the present invention may be used.

As illustrated by FIG. 1a, a human body 62 is placed on a table 64 and has disposed thereabove a radiation source 66 for ionizing radiation, preferably an X-ray tube. In accordance with the present invention, it is desired to make a cross-sectional picture of the human body 62. The radiation source includes a conventional collimator 68, shown simply as a diaphram on the figure, which develops a fan shaped beam of rays which penetrate the body to in a cross-sectional plane. In general, the collimator 68 forms part of the radiation source and can be arranged in its housing.

The fan shaped beam of radiation 70 penetrates the body 62 in the sectional plane being measured and is absorbed differently by different components of the body. The portion of the rays not absorbed strike a scintillator 20. The scintillator 20 can include a carrier of glass or metal containing a luminiscant layer of alkyl halogenide, particularly cesium iodide with one or more activators. These are advantageously applied to the carrier by evaporation in a vacuum. The single layer may also be made of fibers or needles arranged perpendicular to the carrier; such can be prepared by repeated evaporation. The arriving radiation 70 is absorbed by the scintillator and releases photons which releases electrons in the light sensitive layer of a photocathode 22. The photocathode 22 will preferably be a cesium-antimony compound. The electrons are directed from here toward the detector system 24. In the space between the detector system and the photocathode 22 they are accelerated by an applied acceleration voltage $U_B$ of, for example 20 kV and their energy increases correspondingly. The high energy electrons then impinge on the semiconductor detectors.

A large number of individual semiconductors are used. Of these, large groups can be arranged on a common semiconductor body. For example, 10 or as few as 5 can be arranged on a single body. These detector units are indicated on FIG. 1a by the reference numerals 75–79. The figure shows the units separated into the individual detectors. The groups of detectors on common semiconductor bodies are then arranged in a polygonal form as illustrated on the drawing to approximate the arc of the circle. The center of this arc is at the anti cathode of the radiation source 66.

The entire radiation receiver can also be designed so that the image of the radiation 10 is reduced electron-optically by at least one order of magnitude e.g. in the ration of 1 to 13.

The electrical signals supplied by the individual detectors can be directly evaluated in a storage and computer combination and fed to an image display device or printing device which prints the sectional view of the body in accordance with the signals provided.

After one exposure the radiation source and receiver are tilted in the direction of the arrows 72 and 74, about an axis perpendicular to the sectional plane of the body and not specifically shown in the figure, by a predetermined angle and further if radiation of the body 62 takes place with the resulting signals evaluated.

A semiconductor body 2, for instance, of n-conduction silicon with a resistivity of preferably at least 1200 ohm-cm and a thickness of, for instance, 200 μm as well as a dimension of the flat sides of about 100 mm is reduced at its upper flat side in such a manner, e.g., in particular, by thin-etching, that it still has a thickness of preferably at most 40 μm. The semiconductor body, which in this embodiment shown is common for several detectors, has on its lower flat side a fairly large number of charge transfer electrodes, of which only three are shown in the figure and designated as 6, 8 and 10. This semi-conductor body 2 is provided with an electrically insulating layer 4, which may preferably consist of an oxide layer such as silicon oxide SiO or silicon dioxide $SiO_2$, which is about 0.2 μm thick. This oxide layer is removed again on the upper, preferably etched, flat side and subsequently, a thin surface layer of better electric conductivity with a thickness of preferably less than 1 m, and in particular, at most 0.3 μm, prepared on this flat side for use as an electrode for the detector. This layer 42 is of the same conduction type as the base material of the semiconductor body 2 and can be produced preferably by diffusion or ion implantation of doners, preferably phosphorus donors. This doping process gives the surface layer 42 a concentration of charge carriers of preferably at least 10 /cm.

On the lower flat side, the metallic charge transfer electrodes 6, 8 and 10 can be produced by evaporating a metallic layer of electrically highly conductive material, preferably aluminum and by subsequently removing the parts of the surface that are not needed.

For making these charge transfer electrodes, semiconductor electrodes which have been given a metallic character by heavy doping can also be used. These can then be made by well known silicon gate technique. Parallel to the electrodes 6, 8 and 10, p-conduction stripes, not shown in the figure, which prevent lateral spreading (blooming) of the charge signal can also be disfused in.

A detector designed in this manner has the advantage that the boundary of the potential trough 18 runs at least approximately at the electrode 42. The potential trough 18 thus extends at least approximately through the entire semiconductor body 2 and the stored charges are achieved even by incident electron radiation, indicated by arrows 12, 14 and 16, of relatively low energy content.

In some cases it may be advantageous, particularly if a semiconductor body 2 of relatively large area is used, to apply a raster or a grid of strip-like electrodes 44 on the flat side of the semiconductor body opposite the charge transfer electrodes 6, 8 and 10. These strips 44 can be prepared, for instance, by evaporating metal, particularly aluminum, on the semiconductor body 2. They then form a barrier-free electrode system on the heavily doped layer 42. This raster or grid of the electrodes 44 improves the current distribution at the surface of the very high-resistance and very thin semiconductor body 2 of the detectors.

In the embodiment of FIG. 1, CCD components are provided as the radiation receivers for the electron beams 12, 14, 16, in which the semiconductor detecting acting as the radiation receiver forms a structural unit with the associated charge transfer element. In accordance with the present invention, however, any other detector system in which the formation of the signal is accomplished by charge storage and subsequent charge transfer may also be used. For, deviating from the illustration in the illustrated embodiment, separate detectors may also be provided which serve as radiation receivers and charge storage and the stored charge of which is then furnished as the output signal to a respective charge transfer element. These charge transfer elements can then advantageously form a component chain, in which the charges are shifted stepwise in the manner of a shift register. For this embodiment of the detector system, BBD detectors are preferably suited.

In the embodiment of the detector system with semiconductor detectors which are spatially separated from each other and are electrically connected with each other and with charge transfer elements, these charge transfer elements can preferably be provided with a protective covering which is impermeable to electron beams.

Figure 2:
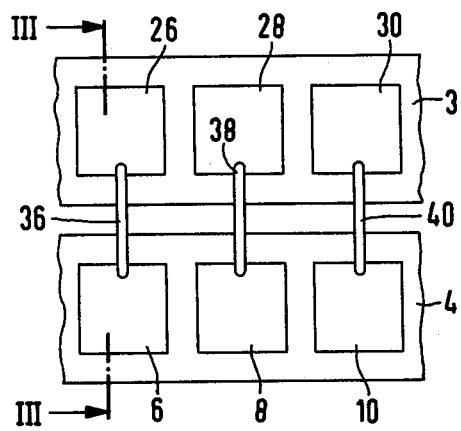
FIG. 2 is a plan view partially in schematic form of a detector arrangement according to the present invention.

In FIG. 2, an embodiment of a detector system for the arrangement for producing a sectional view of a body in accordance with the present invention, in which the semiconductor detectors 26, 28 and 30 and the charge transfer elements 6, 8 and 10 are arranged on separate respective semiconductor bodies, is illustrated schematically. The semiconductor body 3 contains the detectors 26, 28 and 30 at its surface. Between the charge transfer elements 6, 8 and 10 and the associated semiconductor body, an insulating layer 4 may also be provided. A detector with element 26, 28 and 30 is then connected with the associated charge transfer element 6, 8 and 10, respectively, each through an electrical conductor. In the figure, these conductors are designated as 36, 38 and 40.

Figure 3:
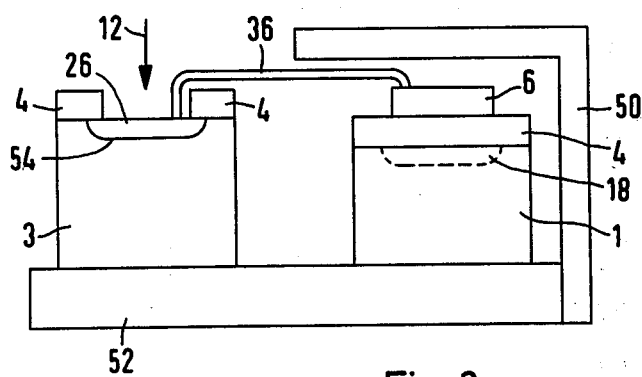
FIG. 3 is a cross-sectional view through the arrangement of FIG. 2.

FIG. 3 is a cross section through the arrangement according to FIG. 2. In one such embodiment, the charge transfer elements may each be provided with a covering 50 which is impervious to electron beams. The two semiconductor bodies 1 and 3 are arranged on a common base plate 52. A suitable doping material is placed in the upper flat side of the semiconductor body 3. This forms a barrier layer 54 in the semiconductor body 3. Those parts of the surface of the semiconductor body 3 at which this barrier layer 54 comes to the surface will preferably also be covered up by an insulating layer 4. The detector barrier electrode 26 is connected through the connecting electrical conductor 36 with the electrode of the charge transfer element 6, which is likewise arranged on an insulating layer 4. In front of the electrode 6, there is a space charge zone 18 in the semiconductor body.

The covering 50 consists of a material of sufficient thickness and density so that it is impermeable to electron beams. This covering thus absorbs all the arriving electron radiation so that this electron radiation only reaches the detector 26, as is indicated in the figure by the arrow 12. The covering may preferably consist of a ferrous alloy (Vakon).

The base plate 52, too, consists, at least in part, of metal, e.g., a ferrous alloy (Vakon), which may preferably further be provided with a gold layer.

What is claimed is:

1. Apparatus for the implementation of a method for producing a sectional view of a body, the picture elements of which are derived from the absorption of ionizing rays which pass through respective body element in the cross-sectional plane of the body in respective different directions and which after conversion into electrical signals, are evaluated and fed to a printer or a display screen, and in which a fan-shaped ray beam going through the body in the cross-sectional plane of the body is fed to a scintillator in the receiver, the photons of which release electrons which are subsequently accelerated and are then converted into the corresponding electrical signals, and in which a detector system and spatially resolving semiconductor detectors for electron rays which are released in the photocathode of an electronic vacuum image converter is provided, the scintillator of which is provided as the receiver of the fan-shaped ray beam, wherein the improvement comprises spatially resolving semiconductor detectors each having associated therewith a charge transfer element, in which the formation of the signal is accomplished by charge storage and charge transfer in the semiconductor body of said semiconductor detectors, said semiconductor detectors each forming a common structural element with their associated charge transfer elements with several semiconductor detectors and their associated transfer elements provided with a common semiconductor body, said semiconductor body being one of the group consisting of N conduction silicon with a high resistivity of at least 600 ohm/cm and P conduction silicon with a resistivity af at least 1800 ohm/cm, said body reduced to a thickness of at most, 80 μm and the surface opposite the charge transfer electrodes provided as the receiving surface for the electron beams.

2. Apparatus according to claim 1, wherein the semiconductor body consists of n-conduction silicon with a resistivity of at least 1200 ohm-cm.

3. Apparatus according to claim 1, wherein the flat side of the semiconductor body opposite the charge transfer electrodes has to a thickness of at most 60 μm at least in the region of the electrodes.

4. Apparatus according to claim 3, wherein said thickness is at most 40 μm.

5. Apparatus according to claim 1, wherein said charge transfer elements are provided with a covering which is impervious to electron beams.

* * * * *